United States Patent [19]
O'Brien et al.

[11] Patent Number: 5,881,989
[45] Date of Patent: Mar. 16, 1999

[54] AUDIO ENCLOSURE ASSEMBLY MOUNTING SYSTEM AND METHOD

[75] Inventors: John J. O'Brien, San Francisco; Roy J. Riccomini, Campbell, both of Calif.

[73] Assignee: Apple Computer, Inc., Cupertino, Calif.

[21] Appl. No.: 812,933

[22] Filed: Mar. 4, 1997

[51] Int. Cl.$^6$ .............................. F16M 13/00; F16B 13/06
[52] U.S. Cl. ...................... 248/634; 248/349.1; 248/922; 403/163; 24/297; 411/41; 411/45
[58] Field of Search ..................................... 248/634, 635, 248/222.12, 917, 638, 349.1, 922; 403/329, 326, 405.1, 407.1, 163, 71, 164; 24/297, 453, 625; 411/41, 45, 55

[56] References Cited

U.S. PATENT DOCUMENTS

| | | | |
|---|---|---|---|
| 4,579,473 | 4/1986 | Brugger | 403/407.1 X |
| 5,096,153 | 3/1992 | Seeley et al. | 248/635 |
| 5,110,081 | 5/1992 | Lang, Jr. | 248/635 |
| 5,131,619 | 7/1992 | Daugherty et al. | 248/635 |
| 5,145,330 | 9/1992 | Uchiyama | 248/635 X |
| 5,303,896 | 4/1994 | Sterka | 248/638 X |
| 5,348,267 | 9/1994 | Lanting et al. | 248/635 |
| 5,540,528 | 7/1996 | Schmidt et al. | 411/55 |
| 5,580,028 | 12/1996 | Tomczak et al. | 248/634 |
| 5,706,559 | 1/1998 | Oliver et al. | 24/297 |
| 5,759,002 | 6/1998 | Essenberg | 411/45 |

*Primary Examiner*—Ramon O. Ramirez
*Assistant Examiner*—Long Dinh Phan
*Attorney, Agent, or Firm*—Carr & Ferrell LLP

[57] ABSTRACT

A vibration-isolating system for mounting a cathode ray tube monitor to an enclosed audio base includes an annular vibration-isolating grommet having an axial bore; a snap cap including an annular portion having a surface for supporting the grommet and an axial aperture, at least two legs extending substantially perpendicularly from the annular portion opposite the surface astride the aperture to distal ends, and a nub extending radially from the distal end of each leg; and an elongated member configured to fit about the legs, through the axial aperture and through the axial bore, and to attach to a cathode ray tube housing.

34 Claims, 3 Drawing Sheets

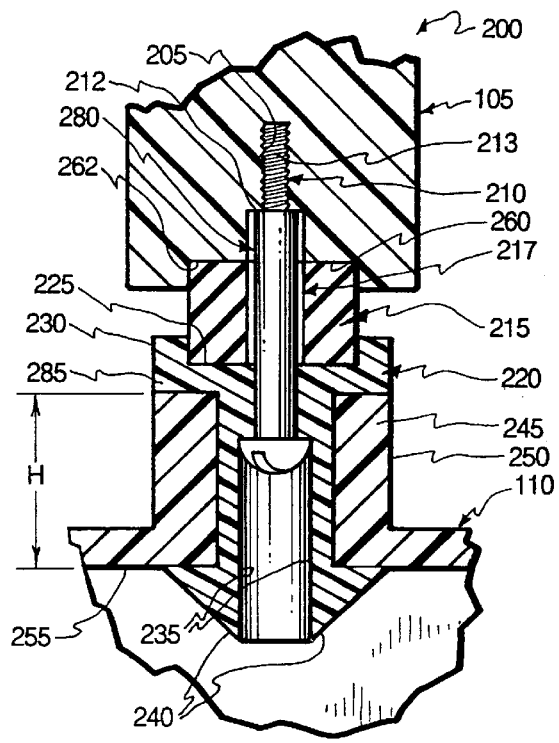
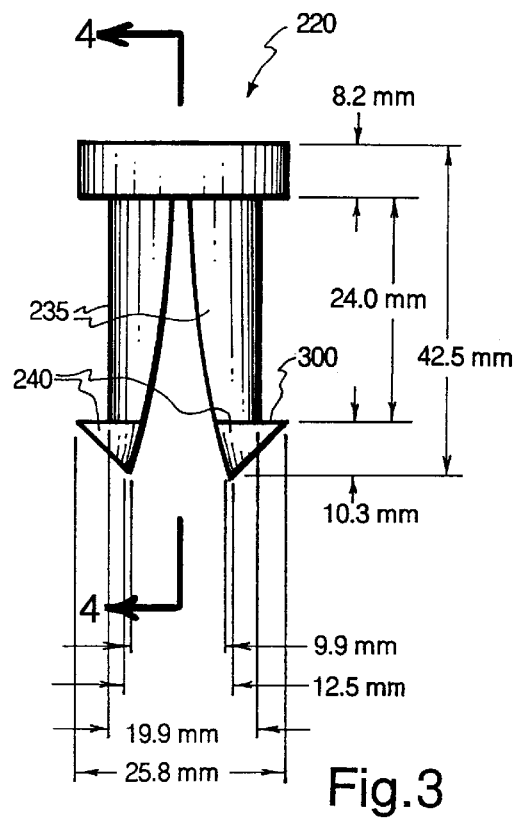
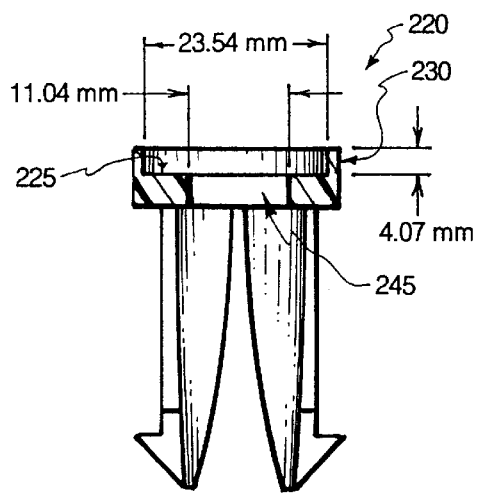
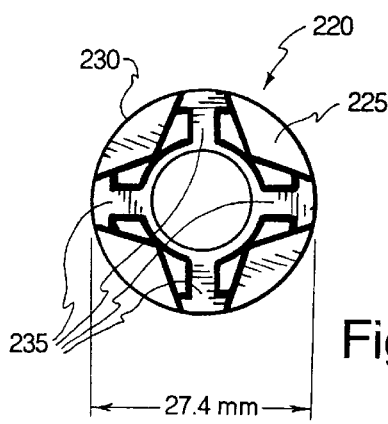
Fig.2
Fig.3
Fig.4
Fig.5

AUDIO ENCLOSURE ASSEMBLY MOUNTING SYSTEM AND METHOD

BACKGROUND OF THE INVENTION

1. Field of the Invention

This invention relates generally to cathode ray tube housings, and more particularly to attaching a computer monitor to a speaker-equipped base while isolating the monitor from vibrational noise caused by the speaker.

2. Description of the Background Art.

Designers of early desktop computers avoided developing sound capabilities of the computers because of their limited memory capacity and processor power. Instead, computers were equipped with low quality sound equipment such as "tinny" sounding two-inch tweeters.

Present increases in the processing power and memory of computers and the advent of multi-media techniques have led computer designers to incorporate high fidelity sound equipment into computers, and specifically into the base portions of computer monitor assemblies. However, speaker vibrations often disturb the operation of computer monitors.

Therefore, a system and method are needed for isolating vibrational noise caused by sound equipment in a computer monitor base from the monitor itself without increasing the difficulty of attaching the base to the monitor.

SUMMARY OF THE INVENTION

The present invention provides a vibration-isolating system and method for mounting a cathode ray tube monitor to an enclosed audio base. The vibration-isolating system includes an annular vibration-isolating grommet having an axial bore; a snap cap including an annular portion having a surface for supporting the grommet and an axial aperture, at least two legs extending substantially perpendicularly from the annular portion opposite the surface astride the aperture to distal ends, and a nub extending radially from the distal end of each leg; and an elongated member configured to fit about the legs, through the axial aperture and through the axial bore, and to attach to a cathode ray tube housing.

The method of the present invention includes the steps of providing an annular grommet having an axial bore; providing a snap cap including an annular portion having a surface for supporting the grommet and an axial aperture, at least two legs extending substantially perpendicularly from the annular portion opposite the surface astride the aperture to distal ends, and a nub extending radially from the distal end of each leg; inserting an elongated member between the legs, through the aperture, through the axial bore and into the attaching bore; attaching the elongated member to the cathode ray tube housing in the attaching bore; and inserting the two legs into the cylinder until the nub extending from each leg engages the ledge.

The present invention advantageously provides a mechanism for mounting a cathode ray tube monitor to an enclosed audio base and for preventing speaker vibrations from affecting the operation of the monitor. Accordingly, computer designers can increase the performance quality of the speakers, and multimedia developers can avail themselves of this increase in speaker performance quality.

BRIEF DESCRIPTION OF THE DRAWINGS

FIG. 2 is a cross-sectional view of the vibration-isolating mounting system FIG. 1;

FIG. 3 is a side view of the snap cap of FIG. 1;

FIG. 4 is a cross-sectional side view of the snap cap of FIG. 3;

FIG. 5 is a top view of the snap cap of FIG. 3; and

DETAILED DESCRIPTION OF THE PREFERRED EMBODIMENT

Figure 1:
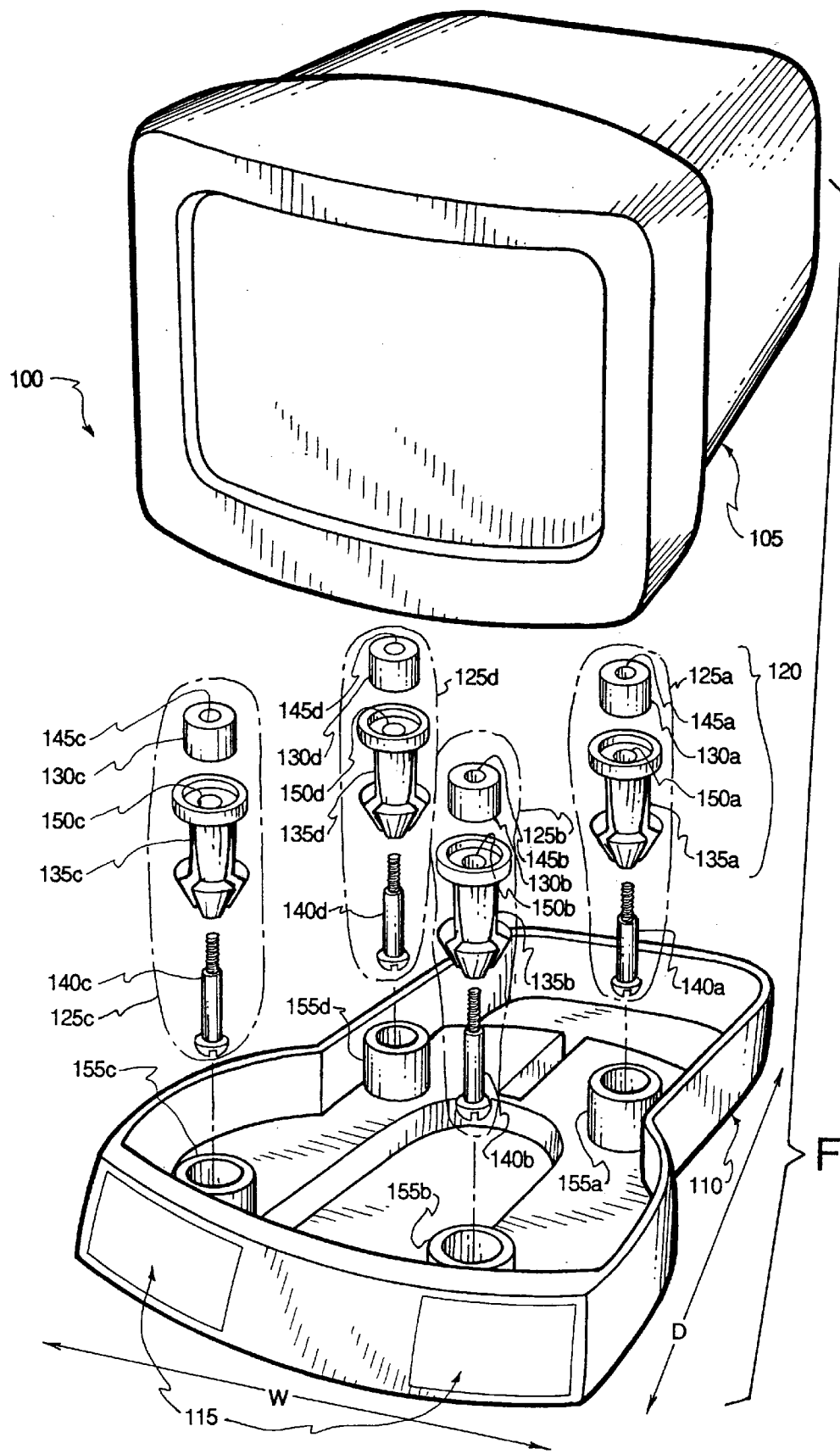
FIG. 1 is an exploded perspective view of an enclosed audio computer monitor assembly in accordance with the present invention.

FIG. 1 is an exploded perspective view of an enclosed audio computer monitor assembly 100 in accordance with the present invention. Computer monitor assembly 100 includes a computer monitor 105, having for example a cathode ray tube, coupled via a vibration-isolating mounting system 120 to an enclosed audio base 110. Enclosed audio base 110 has a width W and a depth D and may comprise high-fidelity sound equipment including speakers 115 for producing high-fidelity stereo sound.

Mounting system 120 connects computer monitor 105 to enclosed audio base 110 and isolates monitor 105 from vibrations caused by speakers 115. Mounting system 120 includes preferably four vibration-isolating subsystems 125a, 125b, 125c and 125d (125a–125d), two of which (125b and 125c) are aligned preferably adjacent the front side of computer assembly 100 at points approximately equal to W/3 from respective sides and two of which (125a and 125d) are aligned preferably at a depth of about D/2 at points also approximately equal to W/3 from the sides.

Each of subsystems 125a–125d includes a respective grommet 130a, 130b, 130c and 130d (130a–130d) designed to isolate frequencies inclusive of the vibrations caused by music and speech. For example, E.A.R. Specialty Composites, a Division of Cabot Corporation of Indianapolis, Indiana, manufactures grommets 130a–130d for isolating specific vibrational frequencies. The dimensions of, the materials used in and the weight placed upon each grommet 130a–130d define the frequencies isolated by the grommets. Accordingly, each grommet 130a–130d is preferably designed to isolate those specific frequencies for weights ranging from the weight of the typically lighter back side of a specific monitor 105 to the weight of the typically heavier front side of the specific monitor 105. Each grommet 130a–130d includes a respective axial bore 145a, 145b, 145c or 145d (145a–145d) for receiving a respective screw 140a, 140b, 140c or 140d (140a–140d).

Each subsystem 125a–125d further includes a respective snap cap 135a, 135b, 135c or 135d (135a–135d) for supporting a respective one of grommets 130a–130d and configured to be inserted into and to snap onto a respective cylinder 155a, 155b, 155c or 155d (155a–155d) in base 110. Thus, subsystems 125a–125d are aligned with cylinders 155a–155d. Each snap cap 135a–135d includes a respective aperture 150a, 150b, 150c or 150d (150a–150d) for receiving a respective one of screws 140a–140d. Snap caps 135a135d are described in more detail with reference to FIGS. 2–5.

Each subsystem 125a–125d further includes a respective screw 140a–140d, configured to be inserted through the corresponding aperture 150a–150d in the respective snap cap 135a–135d, through the corresponding bore 145a–145d in the respective grommet 130a–130d and into a corresponding attaching bore (205, FIG. 2) in monitor 105. Screws 140a–140d are designed not to overcompress grommets 130a–130d, and are described in more detail with reference to FIG. 2.

FIG. 2 is a cross-sectional view of a vibration-isolating subsystem 200, of which each subsystem 125a–125d is an instance, for attaching computer monitor 105 to base 110 and for isolating computer monitor 105 from vibrations caused by sound equipment in base 110.

For each subsystem 200, computer monitor 105 includes an attaching bore 205 having at its opening a ledge 260. Each cylinder 155a–155d is represented by a cylinder 250 which has a ledge 255 at the base 110 end of the cylinder and is aligned with a respective bore 205.

As stated above with reference to FIG. 1, subsystem 200 includes a grommet 215 designed to isolate specific frequencies and having an axial bore 217, includes a snap cap 220 configured to be inserted into and to snap onto cylinder 250, and includes a screw 210 for attaching snap cap 220 and grommet 215 to monitor 105.

Snap cap 220 includes an annular portion 285 having a surface 225 for supporting grommet 215 and an axial aperture 245. Snap cap 220 also includes a wall 230 around the periphery of surface 225 for limiting lateral movement of grommet 215 and for aligning axial bore 217 with snap cap aperture 245. Snap cap 220 also includes legs 235 extending from surface 225 astride aperture 245, and nubs 240 extending radially from the distal ends of legs 235. Legs 235 are configured to be bendable towards each other and slid into cylinder 250 until nubs 240 exit the end of cylinder 250. Then, legs 235 snap back to their original positions, so that nubs 240 engage ledge 255 and secure snap cap 220 to base 110.

Screw 210 is preferably a shoulder screw having a head 214, a shoulder 212, a threaded portion 213 and an unthreaded portion 280. Head 214 preferably does not abut legs 235 so that legs 235 remain free to bend inward. The diameters of shoulder 212 and unthreaded portion 280 are no greater than the diameters of any of aperture 245, bore 217 or attaching bore 205. When threaded portion 213 is screwed into attaching bore 205, shoulder 212 abuts ledge 260 and thus stops unthreaded portion 280 from sliding into attaching bore 205. Thus, unthreaded portion 280 is preferably long enough so that screw 210 does not overcompress grommet 215 and snap cap 220 against computer monitor 105.

It will be appreciated that, when mounting system 200 is fully engaged between computer monitor 105 and base 110, only a certain fraction of the weight of computer monitor 105 (which can be easily computed) rests on grommet 215. Compression of grommet 215 and snap cap 220 by screw 210 is preferably less than the compression caused by the weight of computer monitor 105. Thus, in operation, the weight of monitor 105 alone regulates the compression of grommet 215. Accordingly, each instance of grommet 215 can be designed effectively to isolate computer monitor 105 from vibrations caused by speakers 115. Overcompression occurs when screw 210 compresses the grommet 215 against computer monitor 105 more than compression caused by the weight of computer monitor 105.

FIG. 3 is a side view illustrating example dimensions of snap cap 220 for a 20-inch monitor. Snap cap 220 is about 42.5 millimeters long of which legs 235 are about 24.0 millimeters long. The length of each leg is approximately equal to the height H (FIG. 2) of cylinder 250. Each nub 240 is substantially triangular, about 10.3 millimeters long and about 8 millimeters wide. Each nub 240 has a shoulder portion 300 extending about 2.95 millimeters radially past the outer side of the respective leg 235. Other dimensions include about 9.9 millimeters between the inside portion of the tips of diametrically opposed legs 235, about 12.5 millimeters between the outside portion of the tips of diametrically opposed legs 235, about 19.9 millimeters between the outer sides of diametrically opposed legs 235, about 25.8 millimeters between the outer corners of diametrically opposed nubs 240, and about 8.2 millimeters between the upper edge of wall 230 and the upper ends of legs 235. Although FIG. 3 illustrates snap cap 220 as having only two legs 235, snap cap 220 preferably has four legs 235 centered ninety degrees apart. Legs 235 may be tapered as shown in FIG. 3 or straight as shown in FIG. 2, so long as legs 235 and nubs 240 are sufficiently spaced apart to be compressed inward and slid into a cylinder 250.

FIG. 4 is a cross-sectional side view taken along line A—A of FIG. 3 illustrating other dimensions of snap cap 220. Snap cap 220 surface 225 has a diameter of about 23.5 millimeters, a wall 230 height of about 4 millimeters, and an aperture 245 width of about 11 millimeters.

FIG. 5 is a top view illustrating that snap cap 220 measures about 27.4 millimeters between the outer perimeter of wall 230. FIG. 5 further illustrates the preferred disposition in ninety degree increments of the four legs 235.

Figure 6:
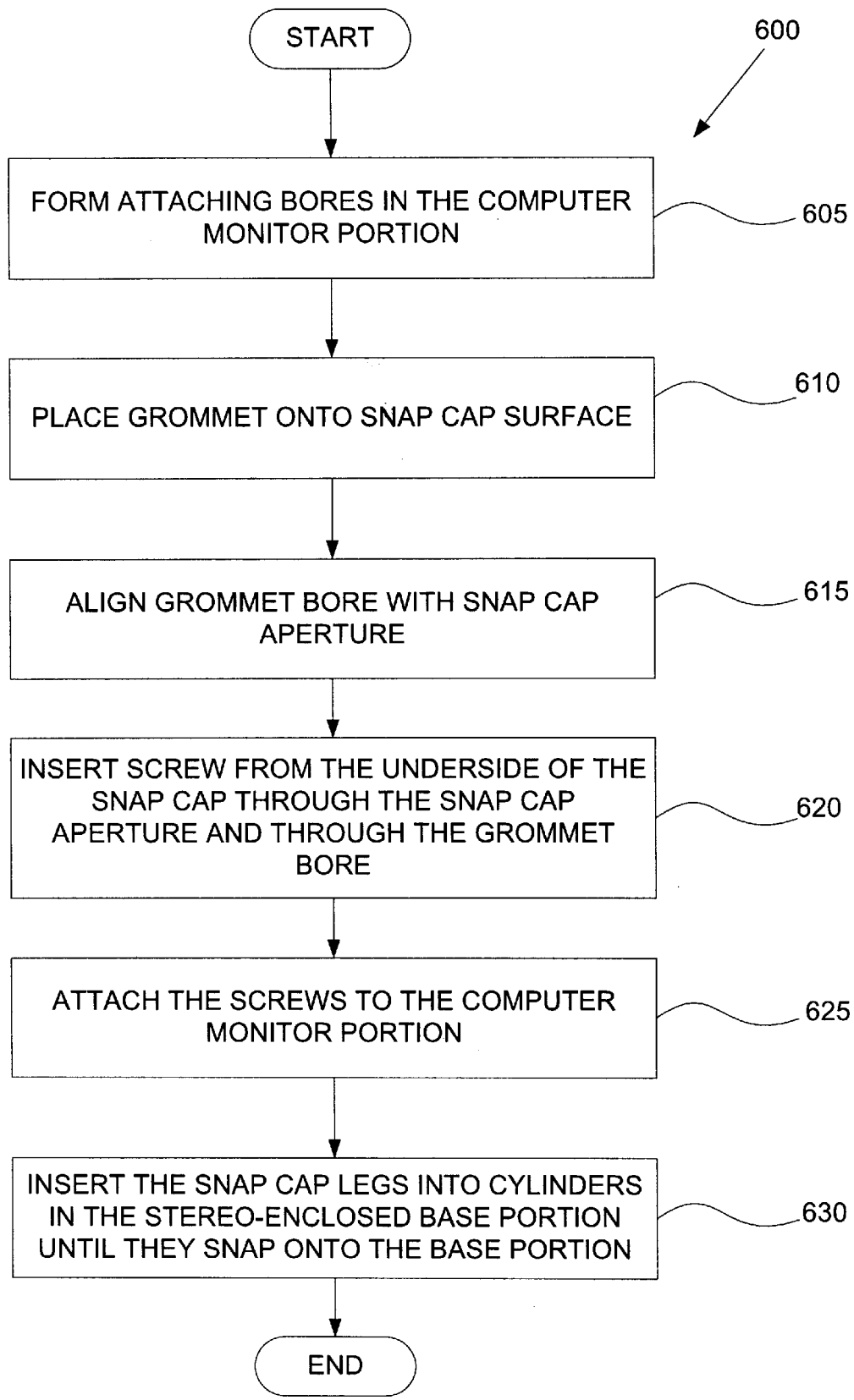
FIG. 6 is a flowchart illustrating a preferred method of attaching the computer monitor to the stereo-enclosed base.

FIG. 6 is a flowchart illustrating a preferred method 600 of mounting computer monitor 105 to enclosed base 110. Method 600 begins in step 605 by forming attaching bores 205 in the underside of computer monitor 105. For each subsystem 200, in step 610 a vibration-isolating grommet 215 is placed onto surface 225 of annular portion 285 of snap cap 220. In step 615, peripheral wall 230 centers axial 215 and thereby aligns grommet bore 217 with aperture 245 in surface 225 of snap cap 220. In step 620, an elongated shoulder screw 210 is inserted from the underside of snap cap 220, between legs 235, through aperture 245 and through bore 217. In step 625, the threaded portion 213 of screw 210 is screwed into attaching bore 205 until screw shoulder 212 abuts ledge 260, thereby maintaining unscrewed portion 280 of screw 210 outside attaching bore 205. As stated above, the length of unscrewed portion 280 must be sufficiently long so that screw 210 does not compress snap cap 220 and grommet 215 against computer monitor 105 more than the compression caused by the weight of computer monitor 105. In step 630, snap cap legs 235 are slid into cylinder 250 of base 110 until legs 235 snap back and nubs 240 engage ledge 255.

The foregoing description of the preferred embodiment of the invention is by way of example only, and variations of the above-described embodiment and method are provided by the present invention. For example, although the mounting system has been described as mounting a computer monitor to an enclosed audio base, the system of the present invention can be used to mount a computer monitor to a base without an audio enclosure. Further, although the system and method of the present invention have been described as isolating vibrations from a computer monitor, the system and method can isolate vibrations from any cathode ray tube or video housing. The embodiment described has been presented for the purpose of illustration and is not intended to be exhaustive or limiting. The invention is limited only by the following claims.

What is claimed is:

1. A snap cap comprising:

an annular portion having a surface for supporting a grommet;

an annular wall formed about a periphery of the surface for laterally limiting the grommet;

an elongated extension extending from the annular portion;

an axial aperture formed through the annular portion and the elongated extension for receiving a cathode ray tube housing attaching mechanism and a shoulder formed within the axial aperture for securing the cathode ray tube housing attaching mechanism within the axial aperture.

2. The snap cap of claim 1 wherein the annular wall is oriented substantially perpendicularly to the surface.

3. The snap cap of claim 1 wherein the elongated extension includes at least two legs each having a nub extending radially from a distal end of the leg.

4. The snap cap of claim 3 wherein each nub includes a shoulder portion for snapping onto the base.

5. The snap cap of claim 1 wherein the elongated extension includes four legs.

6. The snap cap of claim 5 wherein the four legs are equally spaced apart.

7. The snap cap of claim 1 wherein the annular portion is substantially perpendicularly oriented relative to the elongated extension.

8. A snap cap comprising:
an annular portion having a surface for supporting a grommet and an axial aperture for receiving a cathode ray tube housing attaching mechanism through a distal end of the snap cap an annular wall formed about a periphery of the surface for laterally limiting the grommet;
at least two legs extending substantially perpendicularly from the annular portion opposite the surface astride the aperture to respective ends;
a shoulder formed on the legs within the axial aperture for securing the cathode ray tube housing attaching mechanism within the axial aperture; and
a nub extending radially from each end.

9. The snap cap of claim 8 wherein the annular portion surface is substantially perpendicularly oriented to the legs.

10. The snap cap of claim 8 wherein the at least two legs includes four legs.

11. The snap cap of claim 10 wherein the four legs are equally spaced apart.

12. The snap cap of claim 8 wherein each nub includes a shoulder portion for snapping onto the base.

13. The snap cap of claim 8 further comprising a wall around a periphery of the surface for laterally limiting the grommet.

14. A vibration-isolating mounting system comprising:
a base;
a snap cap coupled to the base, the snap cap including
an annular portion having a surface and an axial aperture;
at least two legs extending substantially perpendicularly from the annular portion opposite the surface astride the aperture to distal ends;
an annular grommet having an axial bore, the grommet positioned on the annular portion surface such that the grommet bore and the annular portion aperture are substantially aligned; and
a nub extending radially from the distal end of each leg;
a cathode ray tube housing; and
an elongated member configured to fit between the legs, through the axial aperture and through the axial bore, and to attach to the cathode ray tube housing.

15. The system of claim 14 wherein the at least two legs includes four legs.

16. The system of claim 15 wherein the four legs are equally spaced apart.

17. The system of claim 14 wherein each nub includes a shoulder portion for snapping onto the base.

18. The system of claim 14 wherein the snap cap includes a wall around a periphery of the surface for laterally limiting the grommet.

19. The system of claim 14 wherein the elongated member includes a screw having a threaded portion and an unthreaded portion.

20. The system of claim 19 wherein the cathode ray tube housing includes an attaching bore for receiving only the threaded portion.

21. The system of claim 20 wherein the unthreaded portion is sufficiently long so that, when attached to the cathode ray tube housing, the snap cap and grommet are not overcompressed.

22. The system of claim 14 wherein the grommet isolates vibrations including those caused by music and speech.

23. The system of claim 14 wherein each leg is configured to fit into a cylinder in a base.

24. The system of claim 23 wherein the nub is configured to engage a ledge in the base.

25. A method for mounting a cathode ray tube housing having an attaching bore to a base having a cylinder which terminates in a ledge, comprising the steps of:
a) providing an annular grommet having an axial bore;
b) providing a snap cap including
an annular portion having a surface for supporting the grommet and an axial aperture;
at least two legs extending substantially perpendicularly from the annular portion opposite the surface astride the aperture to distal ends; and
a nub extending radially from the distal end of each leg;
c) positioning the annular grommet on the annular portion surface so that the grommet axial bore and the annular portion axial aperture are substantially aligned;
d) inserting an elongated member between the legs, through the aperture, through the axial bore and into the attaching bore;
e) attaching the elongated member to the cathode ray tube housing in the attaching bore; and
f) inserting the two legs into the cylinder until the nub extending from each leg engages the ledge.

26. The method of claim 25 wherein the at least two legs includes four legs.

27. The method of claim 25 wherein the four legs are equally spaced apart.

28. The method of claim 25 wherein each nub includes a shoulder portion for snapping onto the base.

29. The method of claim 25 wherein the snap cap includes a wall around a periphery of the surface for laterally limiting the grommet.

30. The method of claim 25 wherein the elongated member includes a screw having a threaded portion and an unthreaded portion.

31. The method of claim 30 wherein the attaching bore receives only the threaded portion.

32. The method of claim 31 wherein the unthreaded portion is sufficiently long so that, when attached to the cathode ray tube housing, the snap cap and grommet are not overcompressed.

33. The method of claim 25 wherein the grommet isolates vibrations including those caused by music and speech.

34. The method of claim 25 wherein the nub includes a shoulder portion for engaging the ledge.

* * * * *

UNITED STATES PATENT AND TRADEMARK OFFICE
CERTIFICATE OF CORRECTION

PATENT NO. : 5,881,989
DATED : March 16, 1999
INVENTOR(S) : John J. O'Brien and Roy J. Riccomini It is certified that error appears in the above-identified patent and that said Letters Patent is hereby corrected as shown below:

In the claims:
    Column 5, line 25, insert --;-- after "snap cap".

Signed and Sealed this

Sixth Day of July, 1999

Attest:

Q. TODD DICKINSON

*Attesting Officer*     *Acting Commissioner of Patents and Trademarks*